(12) United States Patent
Tanaka et al.

(10) Patent No.: US 7,351,971 B2
(45) Date of Patent: Apr. 1, 2008

(54) CHARGED-PARTICLE BEAM INSTRUMENT AND METHOD OF DETECTION

(75) Inventors: Yukihiro Tanaka, Saitama (JP); Manabu Saito, Tokyo (JP)

(73) Assignee: Jeol Ltd., Tokyo (JP)

( * ) Notice: Subject to any disclaimer, the term of this patent is extended or adjusted under 35 U.S.C. 154(b) by 11 days.

(21) Appl. No.: 11/479,975

(22) Filed: Jun. 30, 2006

(65) Prior Publication Data
US 2007/0018100 A1  Jan. 25, 2007

(30) Foreign Application Priority Data
Jul. 1, 2005  (JP)  .............................. 2005-193848

(51) Int. Cl.
*H01J 37/26* (2006.01)
*G21K 7/00* (2006.01)
*G01N 23/00* (2006.01)

(52) U.S. Cl. ...................... 250/310; 250/306; 250/307; 250/309; 250/311; 250/396 R; 250/396 ML; 250/397; 250/492.2; 250/492.3

(58) Field of Classification Search ................. 250/310
See application file for complete search history.

(56) References Cited

U.S. PATENT DOCUMENTS 3,753,034 A * 8/1973 Spicer .......................... 315/382
5,254,417 A * 10/1993 Wada ............................. 430/5
6,104,034 A * 8/2000 Frosien et al. ............ 250/396 R
6,534,766 B2 * 3/2003 Abe et al. .................... 250/307
6,797,953 B2 * 9/2004 Gerlach et al. .............. 250/310
6,825,475 B2 * 11/2004 Petrov et al. ........ 250/396 ML
6,952,105 B2 * 10/2005 Cheng et al. ................ 324/751
7,067,807 B2 * 6/2006 Petrov et al. ................ 250/307
7,067,808 B2 * 6/2006 Kochi et al. ................. 250/307
7,218,126 B2 * 5/2007 Cheng et al. ................ 324/751
7,244,932 B2 * 7/2007 Nakasuji et al. ............ 250/306
2001/0010357 A1 * 8/2001 Ose et al. .................... 250/311
2004/0056207 A1 * 3/2004 Petrov et al. ........ 250/396 ML
2006/0049348 A1 * 3/2006 Petrov et al. ................ 250/307
2007/0018100 A1 * 1/2007 Tanaka et al. .............. 250/310

FOREIGN PATENT DOCUMENTS

JP  08-185823  7/1996

* cited by examiner

*Primary Examiner*—David A. Vanore
*Assistant Examiner*—Bernard Souw
(74) *Attorney, Agent, or Firm*—The Webb Law Firm

(57) ABSTRACT

A charged-particle beam instrument and method are offered which can inspect side and rear surfaces of the outer periphery of a specimen. The instrument has a source of the charged-particle beam and an objective lens for focusing the beam onto the specimen positioned inside a specimen chamber. The instrument further includes an electrostatic electrode and a deflection voltage power supply for applying a deflection voltage to the electrostatic electrode located on a downstream side of the objective lens. The electrostatic electrode reflects or deflects the beam passed through the objective lens such that the beam is directed at the specimen.

16 Claims, 10 Drawing Sheets

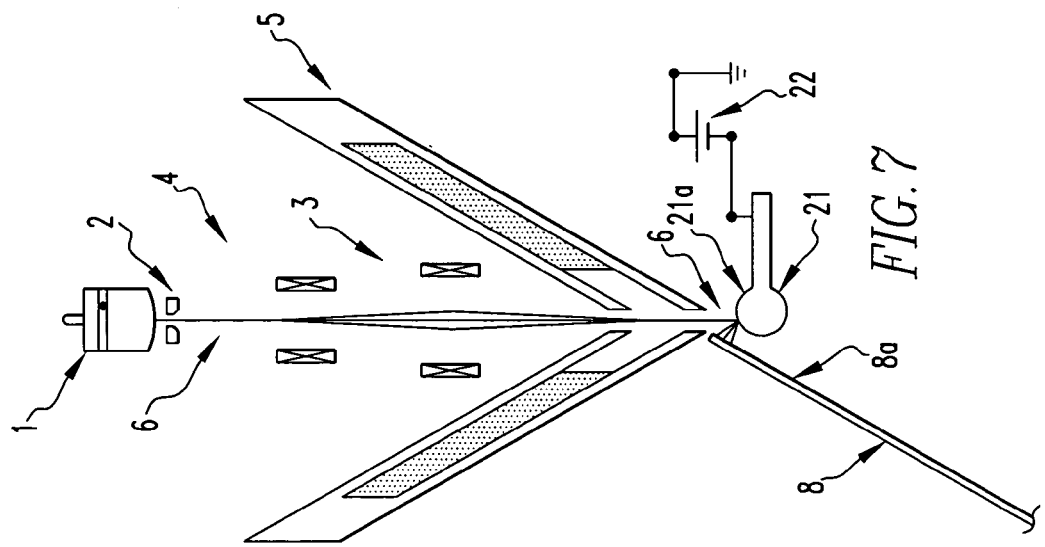
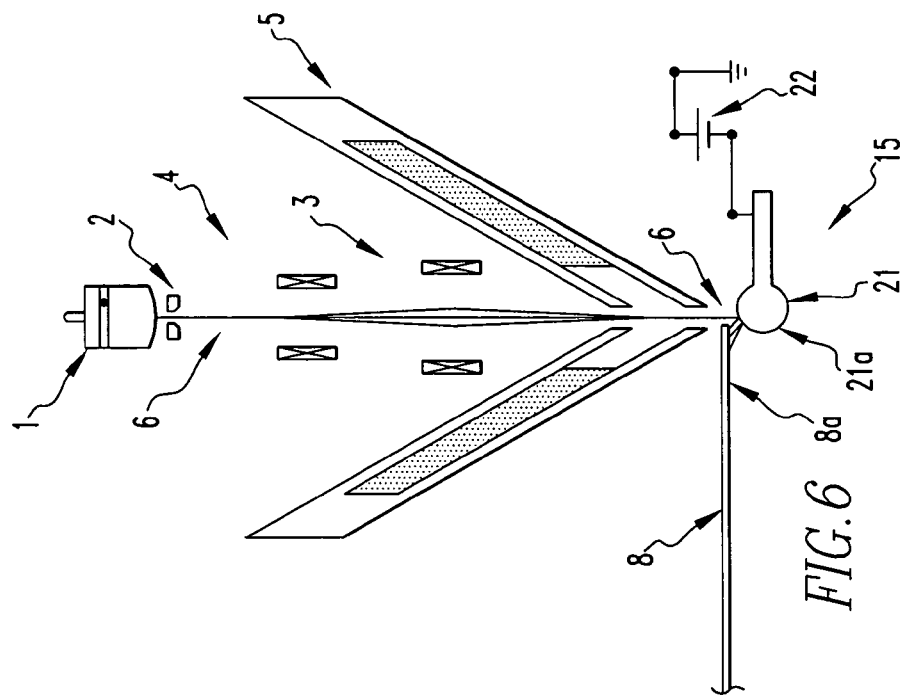

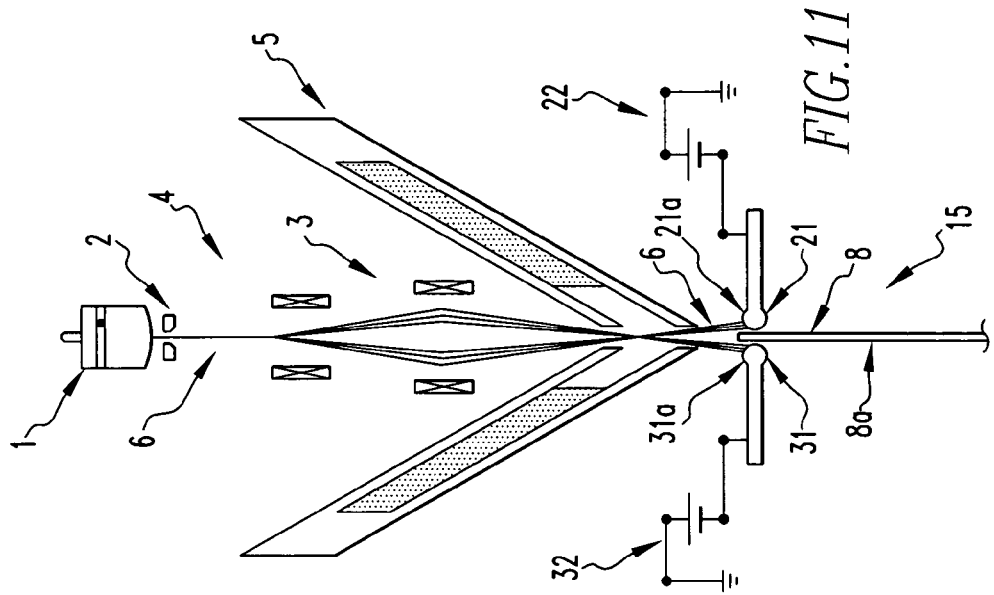
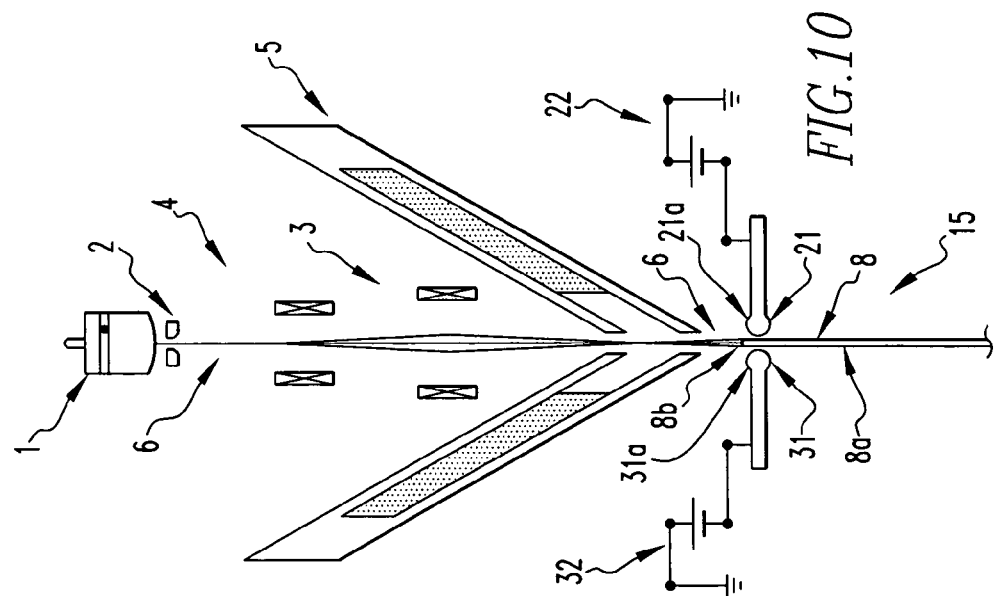

CHARGED-PARTICLE BEAM INSTRUMENT AND METHOD OF DETECTION

BACKGROUND OF THE INVENTION

1. Field of the Invention

The present invention relates to a charged-particle beam instrument and to a method of detecting information from a specimen using a charged-particle beam.

2. Description of Related Art

Charged-particle beam instruments having the configuration of a scanning electron microscope (SEM) have been developed as instruments for inspecting specimens, such as semiconductor wafers. In such an instrument, an electron beam is used as the charged-particle beam. When a specimen is scanned with this electron beam, information emanating from the specimen is detected.

Normally performed inspection of specimens is to detect electrons, such as secondary electrons, emanating from a specimen when it is scanned with an electron beam. Based on the detection, a scanned image of the specimen is obtained. Inspection of the specimen is carried out by checking the scanned image obtained in this way.

The structure of such a charged-particle beam instrument is shown in FIG. 1. The instrument has an electron gun 1 that is a source of a beam of charged particles. The gun 1 emits an electron beam 6 which is accelerated by a given accelerating voltage and directed at a specimen 8. The specimen 8 is a substrate to be inspected, such as a semiconductor wafer. The specimen is positioned within a specimen chamber 15 by a specimen stage (not shown).

The electron beam 6 emitted from the electron gun 1 is made to pass through an aperture mechanism 2 to appropriately limit the beam current at the specimen. The beam 6 passed through the aperture mechanism 2 is passed through a deflection system 3 consisting of two deflectors 3a and 3b and through an objective lens 5. Then, the beam arrives at the specimen 8.

At this time, the deflection system 3 appropriately deflects the beam 6. A scanning unit 11 is connected with the deflection system 3 such that a desired scan signal is supplied to the deflection system 3 from the scanning unit 11. The deflection system 3 is driven based on the scan signal supplied from the scanning unit 11. As a result, the electron beam 6 is deflected.

The objective lens 5 focuses the electron beam 6 onto the surface of the specimen 8. The beam 6 focused by the objective lens 5 is scanned over the specimen 8 by deflecting action of the deflection means 3. An electron optical microscope column 4 is formed by the electron gun 1, aperture mechanism 2, deflection means 3, and objective lens 5.

Electrons 7 to be detected, such as secondary electrons, are produced from the region of the specimen 8 scanned by the electron beam 6. The electrons 7 are detected by an electron detector 9 disposed within the specimen chamber 15. The detector 9 produces an output signal indicative of the result of detection of the electrons 7.

The output signal from the electron detector 9 is amplified by an amplifier 10 and supplied to a display unit 12 consisting of a CRT or the like disposed outside the specimen chamber 15. The display unit 12 is supplied with a scan signal from the scanning unit 11. A scanned image of the specimen 8 based on the output signal from the detector is displayed on the display unit 12 by synchronizing the scan signal with the output signal from the detector.

An accelerating voltage power supply 13 is used to supply an accelerating voltage for accelerating the electron beam 6 emitted from the electron gun 1. The accelerating voltage supplied by the voltage power supply 13 assumes a desired negative potential relative to ground potential and is applied to the electron gun 1.

If necessary, a different negative potential is applied to the specimen 8 from a specimen application voltage power supply 14. Where a negative potential is applied to the specimen 8, the electron beam 6 directed at the specimen 8 is decelerated immediately prior to arrival at the specimen 8. This permits high-resolution imaging of the specimen 8.

Where the specimen 8 is inspected using the charged-particle beam instrument constructed as described above, tilted observation of the specimen surface can be made by tilting the specimen 8 as shown in FIG. 2. In this case, the specimen 8 is tilted by tilting the specimen stage (not shown) carrying the specimen 8 thereon.

In another method being discussed, an auxiliary deflector 16 is mounted between an objective lens 5 and a specimen 8 as shown in FIG. 3. This deflector 16 is energized to tilt an electron beam 6 impinging on the specimen 8.

In a further method being discussed, an electron beam 6 is offset by deflecting action of deflection system 3 as shown in FIG. 4 such that the beam 6 is incident on the main face of the objective lens 5 at an angle. In this case, aberrations, such as coma, are produced in the electron beam 6 because the beam 6 is incident on the objective lens 5 at an angle. Therefore, it has been proposed to mount an auxiliary coil 17 to correct the aberrations.

In one known structure, axisymmetrical electrodes between which an electron beam can pass are disposed in the electron beam passage within the objective lens to perform high-resolution imaging of a tilted specimen (see, for example, Japanese Patent Laid-Open No. H8-185823).

In semiconductor fabrication processes in which semiconductor wafers undergo various processing steps, such as photolithography, many of defects produced in the production steps are caused by problems occurring at the outer peripheries of wafers. Often, such defects are caused by the fact that the outer peripheries of wafers are supported by guide devices and fixing devices to align the semiconductor wafers. Accordingly, it is necessary to make observation of side and rear surfaces of the outer periphery of each wafer as well as tilted observation of the surface of the wafer by SEM, in order to identify the problems caused by defects produced around the outer periphery of the semiconductor wafer.

Where one tries to inspect side and rear surfaces of the outer periphery of a semiconductor wafer that is a specimen by the use of a charged-particle beam instrument having the SEM structure described above, it is necessary to tilt the specimen stage by more than 90°. This complicates the structure of the specimen stage. In addition, there is the problem that the stage is made very bulky.

In the method of deflecting the charged-particle beam by deflection means, the deflection angle of the primary beam relative to the optical axis can be increased up to approximately 15°. However, a function of deflecting the beam even to the rear surface of the specimen is not yet achieved.

SUMMARY OF THE INVENTION

It is an object of the present invention to provide a charged-particle beam instrument which has a simple structure but can inspect side and rear surfaces of the outer periphery of a specimen. It is another object of the present invention to provide a method of detecting information produced from a specimen by the use of a charged-particle beam.

A charged-particle beam instrument according to one embodiment of the present invention has a source of charged particles for emitting an accelerated charged-particle beam, an objective lens for focusing the beam onto a specimen placed inside a specimen chamber, the deflection system located between the source of the beam and the objective lens and acting to deflect the beam, and a detector for deflecting information produced from the specimen in response to impingement of the beam on the specimen. The instrument further includes an electrostatic electrode located on a downstream side of the objective lens and a deflecting voltage power supply for applying a deflection voltage to the electrostatic electrode, which acts to deflect the beam passed through the objective lens such that the beam impinges on the specimen.

A method of detecting information from a specimen by the use of a charged-particle beam in accordance with the present invention is used to detect information produced from the specimen by focusing the charged-particle beam by an objective lens and directing the focused beam at the specimen. The beam passed through the objective lens is deflected by an electrostatic electrode located on a downstream side of the objective lens such that the deflected beam is directed at the specimen.

Another method of detecting information from a specimen by the use of a charged-particle beam in accordance with the present invention is used to detect information produced from the specimen by focusing the charged-particle beam by an objective lens and directing the focused beam at the specimen. The beam passed through the objective lens is deflected by any one of first and second electrostatic electrodes located on a downstream side of the objective lens such that the deflected beam is directed at the specimen.

In the present invention, the charged-particle beam passed through the objective lens is deflected by an electrostatic electrode located on a downstream side of the objective lens. The deflected beam is directed at the specimen. Information from the specimen is detected.

Consequently, a side or rear surface of the outer periphery of the specimen can be inspected by placing the side or rear surface of the outer periphery of the specimen in an opposite relation to the electrostatic electrode such that the side or rear surface of the outer periphery faces the electrostatic electrode. In this way, the side or rear surface of the outer periphery of the specimen can be inspected with a simple instrumental configuration.

Other objects and features of the invention will appear in the course of the description thereof, which follows.

BRIEF DESCRIPTION OF THE DRAWINGS

FIG. 6 is a diagram illustrating a first embodiment of the method of detecting information from a specimen in accordance with the present invention;

FIG. 7 is a diagram illustrating a second embodiment of the method of detecting information from a specimen in accordance with the present invention;

FIGS. 10 and 11 are diagrams illustrating a fifth embodiment of the method of detecting information from a specimen in accordance with the present invention;

DESCRIPTION OF THE PREFERRED EMBODIMENTS

Figure 5:
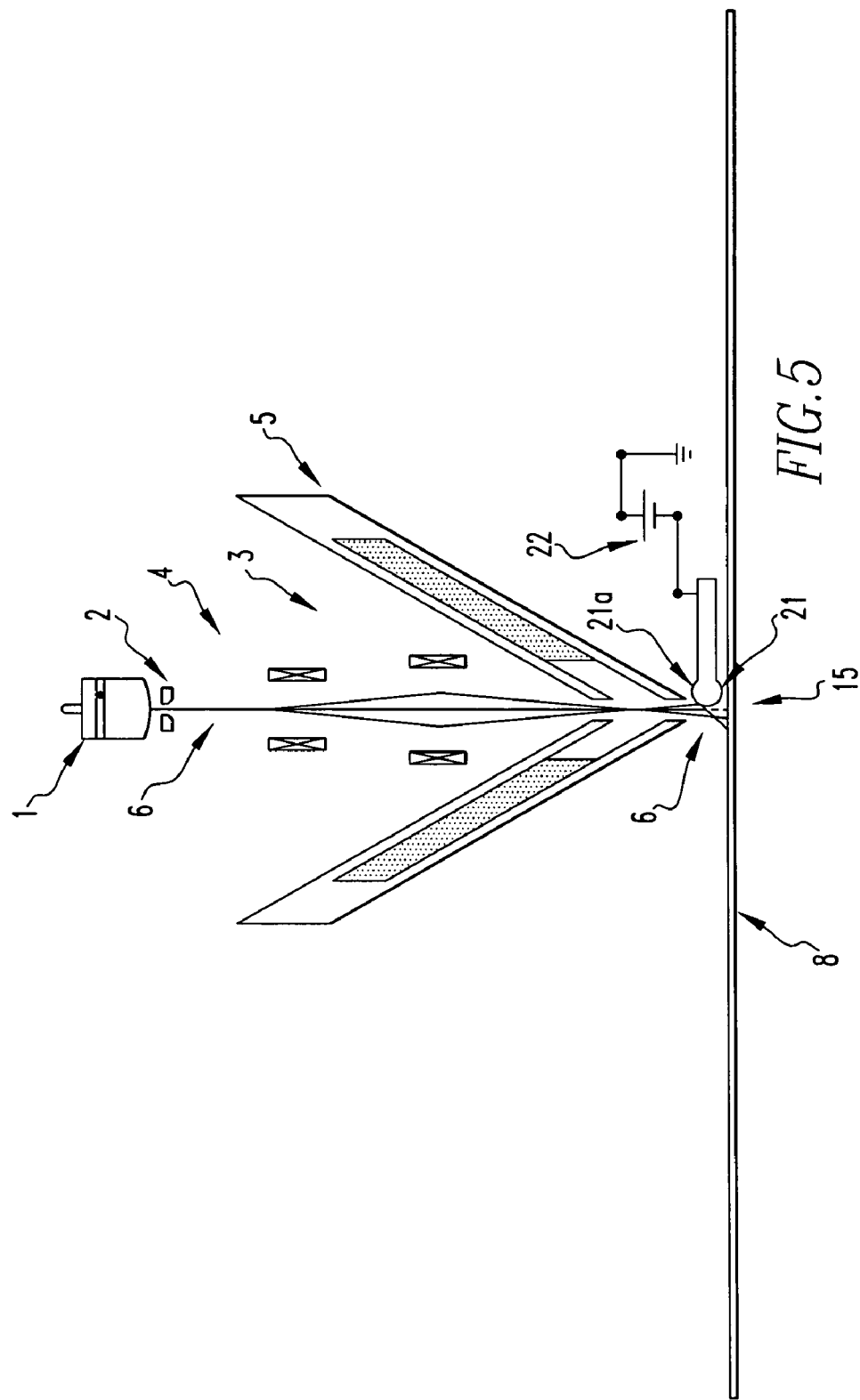
FIG. 5 is a schematic diagram of main portions of a charged-particle beam instrument according to one embodiment of the present invention.

Embodiments of the present invention are hereinafter described with reference to the accompanying drawings. FIG. 5 is a schematic diagram showing main portions of a charged-particle beam instrument according to an embodiment of the present invention. This instrument has the configuration of a scanning electron microscope (SEM). The instrument has a specimen chamber 15 in which a specimen 8 is placed. An electrostatic electrode 21 is mounted in the specimen chamber 15.

Figure 1:
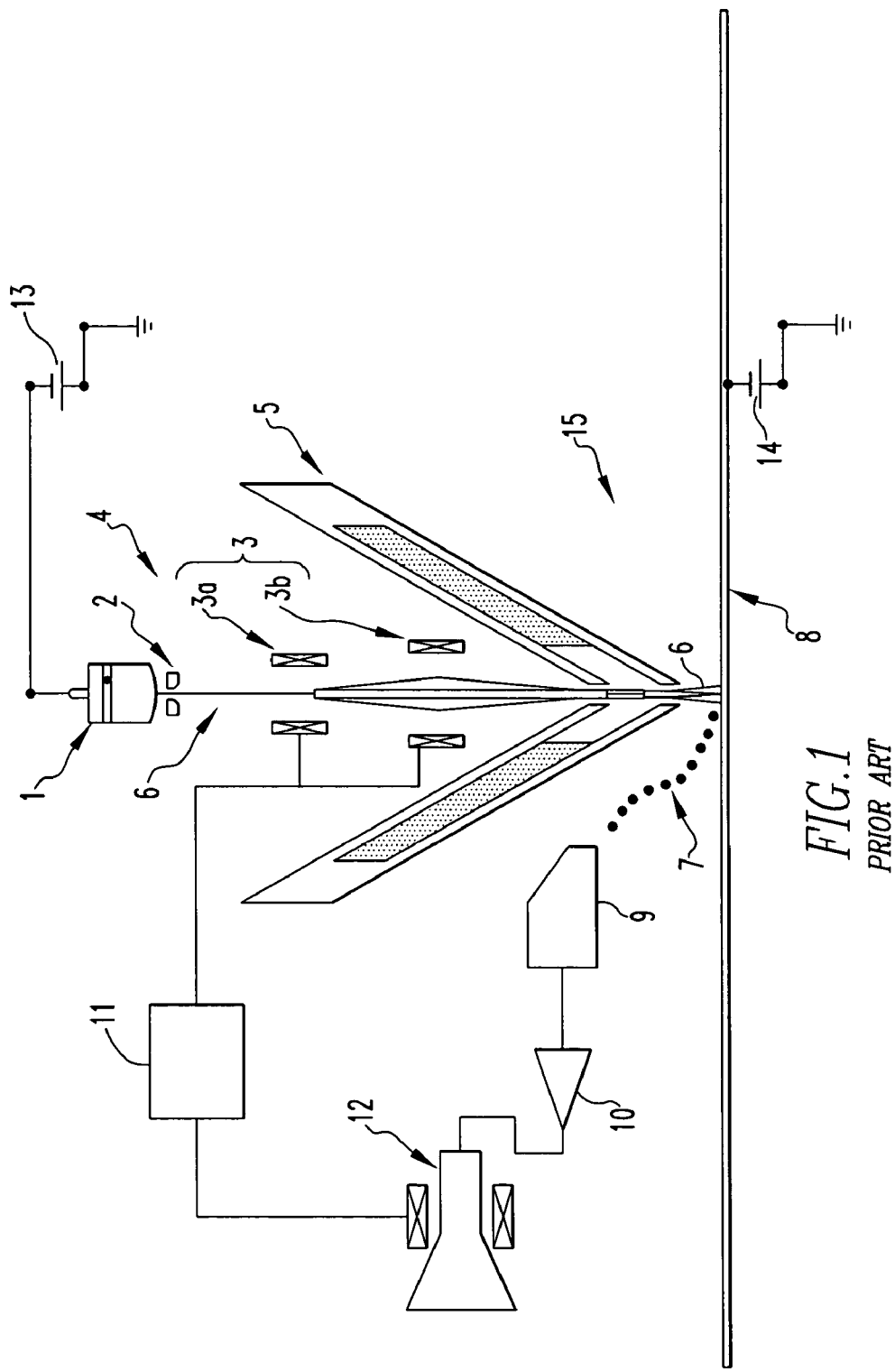
FIG. 1 is a schematic diagram of the prior art charged-particle beam instrument.
Figure 2:
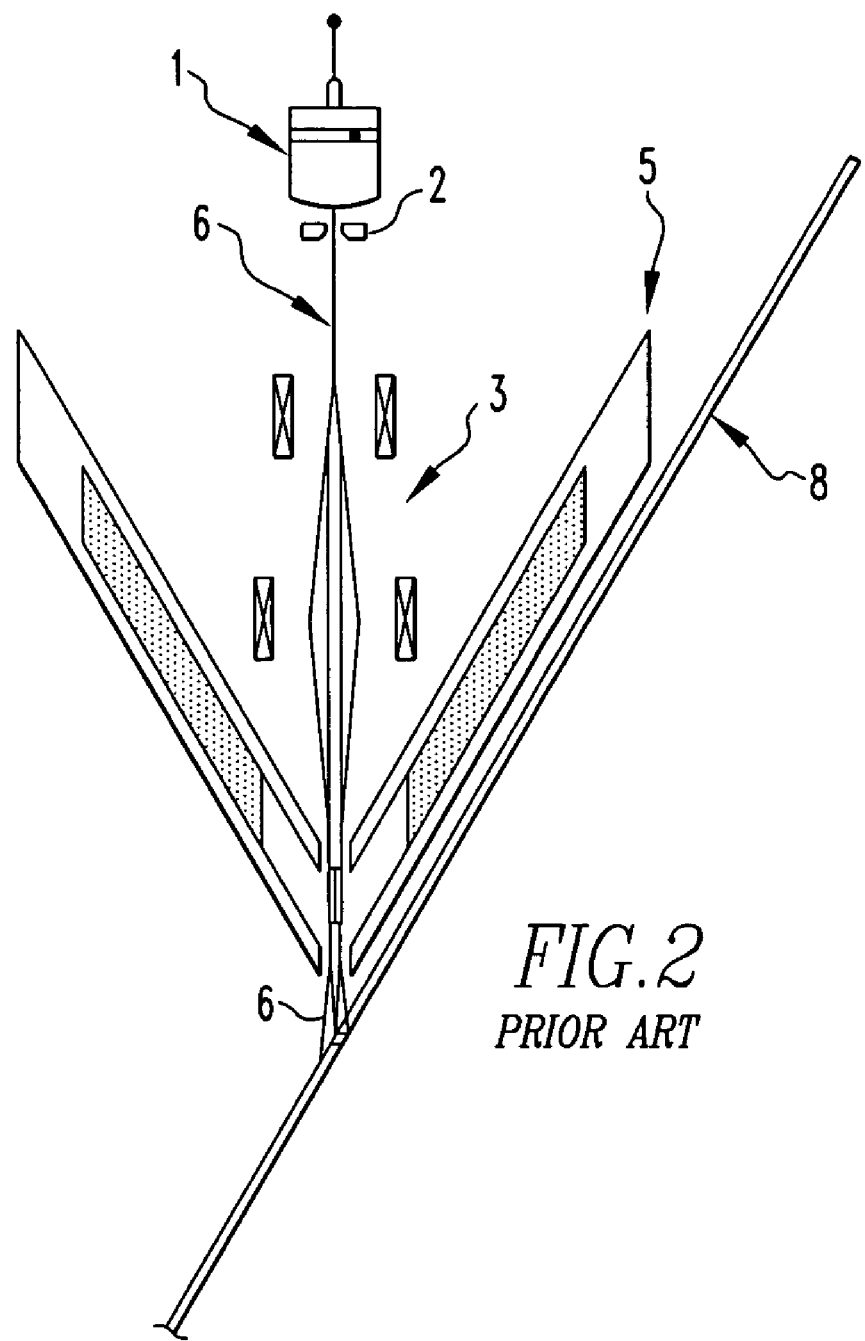
FIG. 2 is a diagram illustrating the manner in which a specimen is observed in a tilted state.
Figure 3:
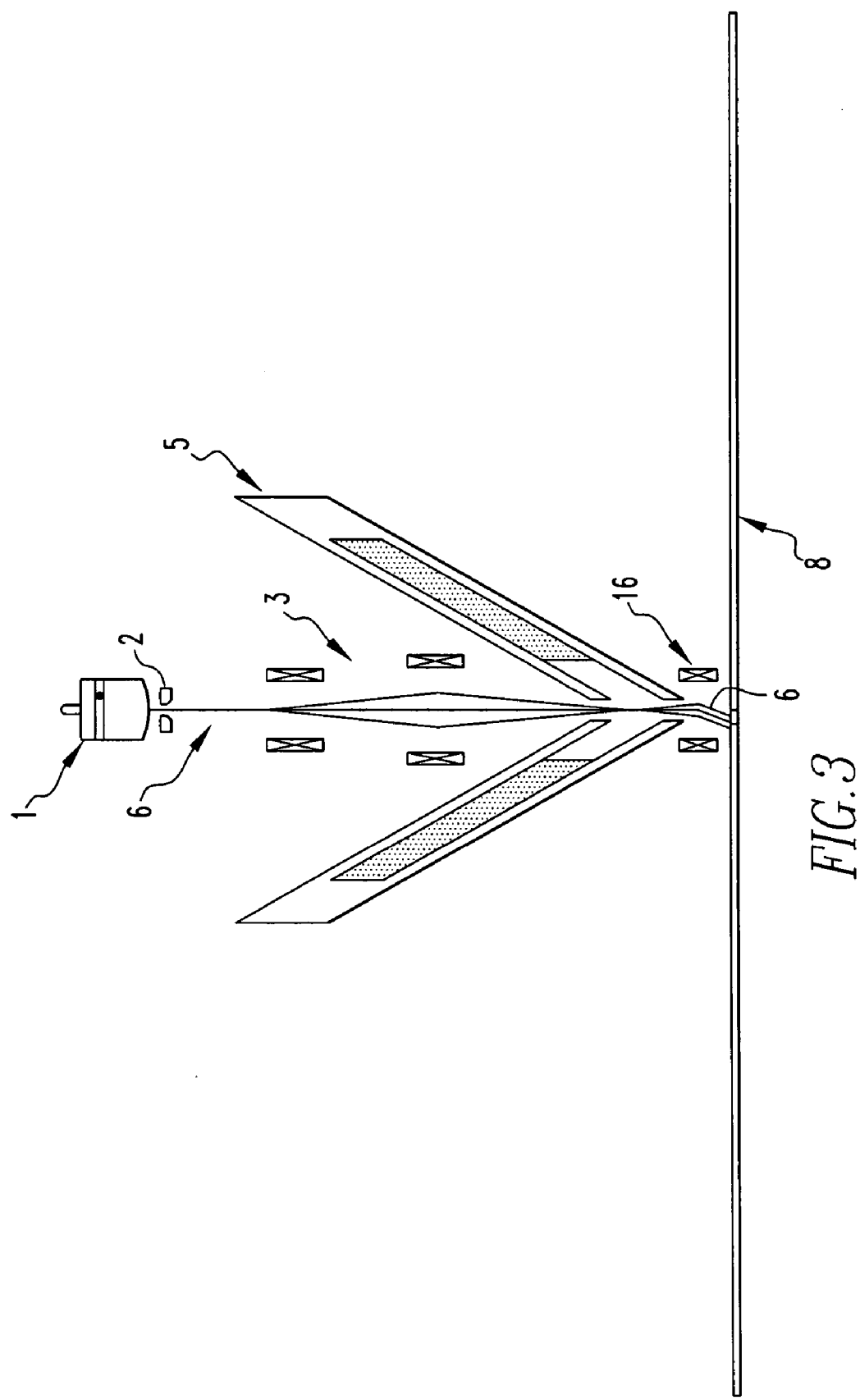
FIG. 3 is a diagram illustrating the manner in which an auxiliary deflector is mounted between an objective lens and a specimen by a known method.
Figure 4:
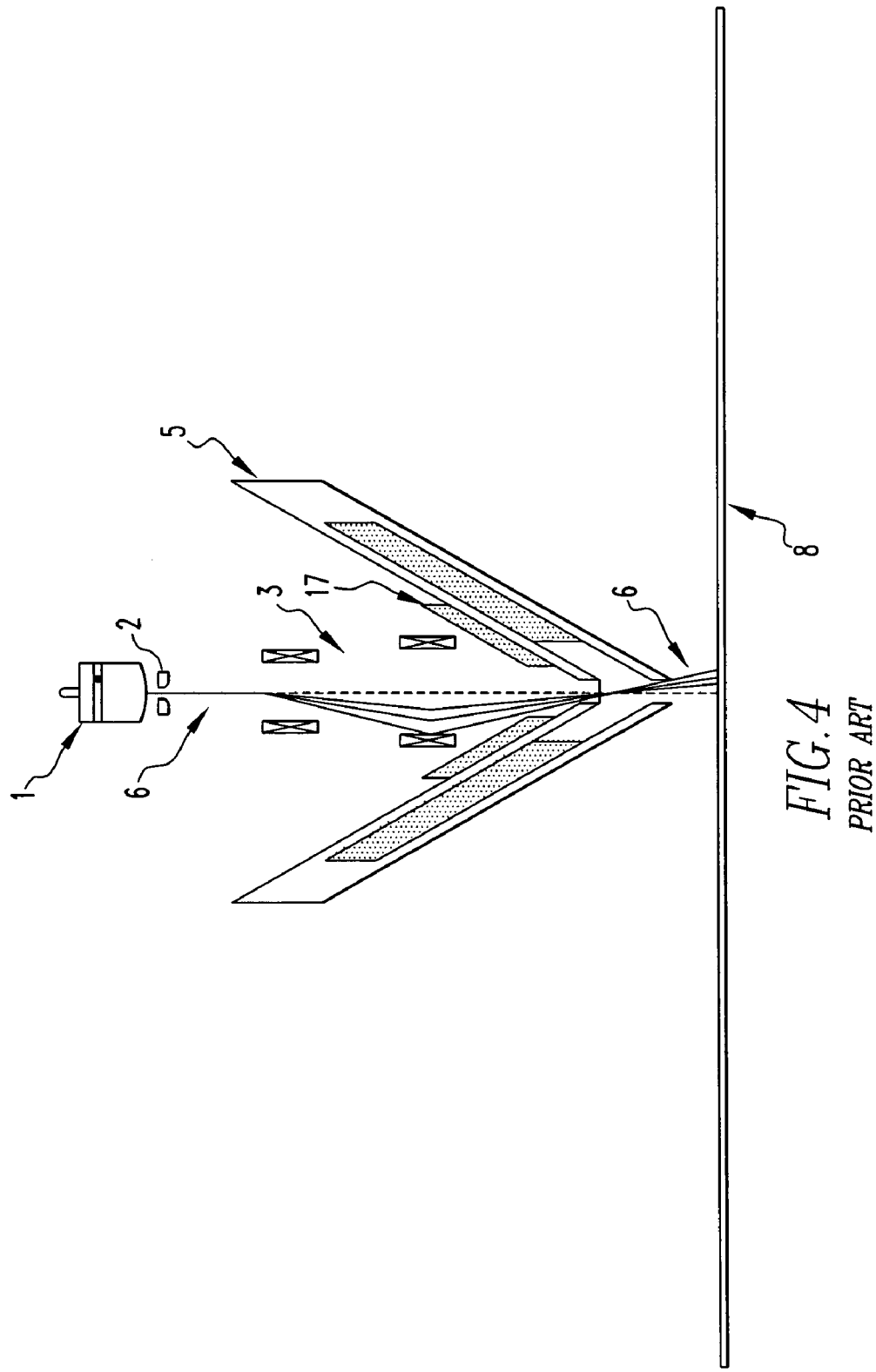
FIG. 4 is a diagram illustrating the manner in which an electron beam is offset deflected by another known method.

This charged-particle beam instrument is similar to the charged-particle beam instrument already described in connection with FIG. 1 in other respects. In particular, an electron gun 1 that is a source of a charged-particle beam emits an electron beam (charged-particle beam) 6, which is accelerated by a given acceleration voltage and directed at the specimen 8. The specimen 8 is a substrate to be inspected, such as a semiconductor wafer. The specimen 8 is positioned inside the specimen chamber 15 by a specimen stage (not shown).

An accelerating voltage power supply 13 is connected with the electron gun 1. The accelerating voltage power supply 13 supplies an accelerating voltage for accelerating the electron beam 6 emitted from the electron gun 1. The accelerating voltage assumes a desired negative potential relative to ground potential.

The electron beam 6 emitted from the electron gun 1 is made to pass through an aperture mechanism 2 to appropriately limit the beam current at the specimen. The beam 6 passed through the aperture mechanism 2 is passed through deflection system 3 consisting of two deflectors 3a and 3b and through an objective lens 5. Then, the beam arrives at the specimen 8.

At this time, the deflection system 3 appropriately deflects the beam 6. A scanning unit 11 is connected with the deflection system 3 such that a desired scan signal is supplied to the deflection system 3 from the scanning unit 11. The deflection system 3 is driven based on the scan signal supplied from the scanning unit 11. As a result, the electron beam 6 is deflected. The objective lens 5 focuses the electron beam 6 onto the specimen 8 disposed within the specimen chamber 15. The specimen 8 is at ground potential.

In the present embodiment, the aforementioned electrostatic electrode 21 is disposed on a downstream side of the objective lens 5 within the specimen chamber 15. The electron beam 6 is focused by the objective lens 5 to a position located more downwardly from the surface of a front end portion 21a of the electrostatic electrode 21. The front end portion 21a is spherical in shape. An electron optical microscope column 4 is formed by the electron gun 1, aperture mechanism 2, deflection means 3, and objective lens 5.

A deflection voltage power supply 22 is connected with the electrostatic electrode 21 to apply a desired deflection voltage to the electrode 21. The deflection voltage is set equal to or higher than the accelerating voltage applied to the electron gun 1.

Thus when the electron beam 6 passed through the objective lens 5 is made to hit the electrostatic electrode 21, the beam is reflected from the surface of the front end portion 21a of the electrode 21 at an angle corresponding to the incident angle to the surface.

A deflection voltage is applied to the electrostatic electrode 21. The electric field produced by the front end portion 21a of the electrode 21 spreads out radially. Therefore, the electron beam 6 passed through the objective lens 5 is reflected at the angle corresponding to the incident angle to the surface of the front end portion 21a by the action of the radially spreading electric field produced by the front end portion 21a of the electrode 21.

The electron beam 6 reflected by the electrostatic electrode 21 in this way is directed at the specimen 8 and scans it. Electrons 7 to be detected such as secondary electrons are produced from the scanned specimen 8. The electrons 7 are detected by an electron detector 9 disposed in the specimen chamber 15. The detector 9 produces an output signal indicative of the result of detection of the electrons 7.

The output signal from the electron detector 9 is amplified by an amplifier 10 and supplied to a display unit 12 consisting of a CRT or the like disposed outside the specimen chamber 15. The display unit 12 is supplied with a scan signal from the scanning unit 11. A scanned image of the specimen 8 based on the output signal from the detector is displayed on the display unit 12 by synchronizing the scan signal with the output signal from the detector. If necessary, a different negative potential may be applied to the specimen 8 from a specimen application voltage power supply 14.

A method of detecting information from the specimen by the use of the above-described charged-particle beam instrument is next described. FIG. 6 is a diagram illustrating a first embodiment of the method of detecting information from the specimen in accordance with the present invention.

In the embodiment shown in FIG. 6, the rear surface of the outer periphery 8a of the specimen 8 to be detected is inspected. In this embodiment, the outer periphery 8a of the specimen 8 is placed as a detected portion in a close relation to the gap between the front end of the objective lens 5 and the front end portion 21a of the electrostatic electrode 21.

The electron beam 6 passed through the objective lens 5 is directed at the front end portion 21a of the electrostatic electrode 21. The beam 6 is reflected from the front end portion 21a of the electrode 21 and impinges on the rear surface of the outer periphery 8a of the specimen. At this time, a scan signal is supplied from the scanning unit 11 to drive the deflection system 3, thus deflecting the beam 6 passing through the objective lens 5. As a result, the beam 6 reflected from the front end portion 21a of the electrostatic electrode 21 scans the rear surface of the outer periphery 8a of the specimen. The rear surface of the outer periphery 8a is located at a side of the electrostatic electrode, and is a specimen surface to be inspected.

The electrons 7 (see FIG. 1) to be detected are produced from the rear surface of the outer periphery 8a of the specimen scanned with the electron beam 6 in this way. The produced electrons 7 are detected by the electron detector 9, which in turn produces an output signal indicative of the result of the detection. The output signal from the detector 9 is amplified by the amplifier 10 and supplied to the display unit 12. The display unit 12 is supplied with a scan signal from the scanning unit 11. A scanned image based on the output signal from the detector is displayed on the display unit 12 by synchronizing the scan signal with the output signal from the detector.

A second embodiment of the method of detecting information from a specimen in accordance with the present invention is next described by referring to FIG. 7. In this embodiment, the specimen 8 is tilted by the specimen stage (not shown).

Also in this embodiment, the outer periphery 8a of the specimen 8 is detected in the same way as in the first embodiment. The rear surface of the outer periphery 8a is inspected. The outer periphery 8a is located close to the gap between the front end of the objective lens 5 and the front end portion 21a of the electrostatic electrode 21.

In this second embodiment, the rear surface of the outer periphery of the specimen 8 can be observed vertically by appropriately adjusting the positional relationship among the position of the objective lens 5, the position of the electrostatic electrode 21, and the position at which the specimen 8 is tilted.

Figure 8:
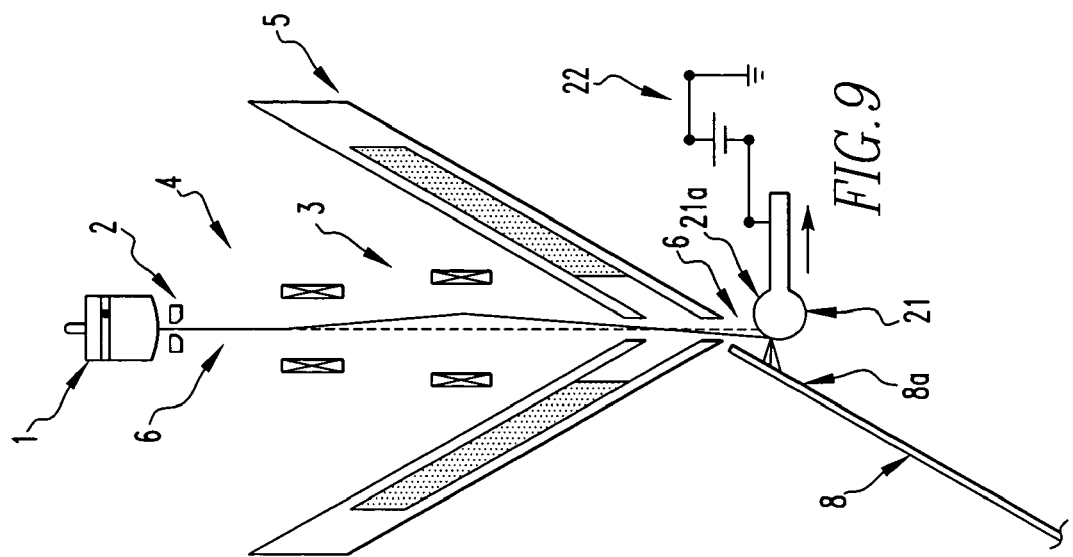
FIG. 8 is a diagram illustrating a third embodiment of the method of detecting information from a specimen in accordance with the present invention.

The electrostatic electrode 21 may be made movable to control the position of the electrode 21 in the same way as in a third embodiment shown in FIG. 8. The electrostatic electrode 21 is mounted to a drive mechanism (not shown), which in turn controllably moves the electrode 21.

Figure 9:
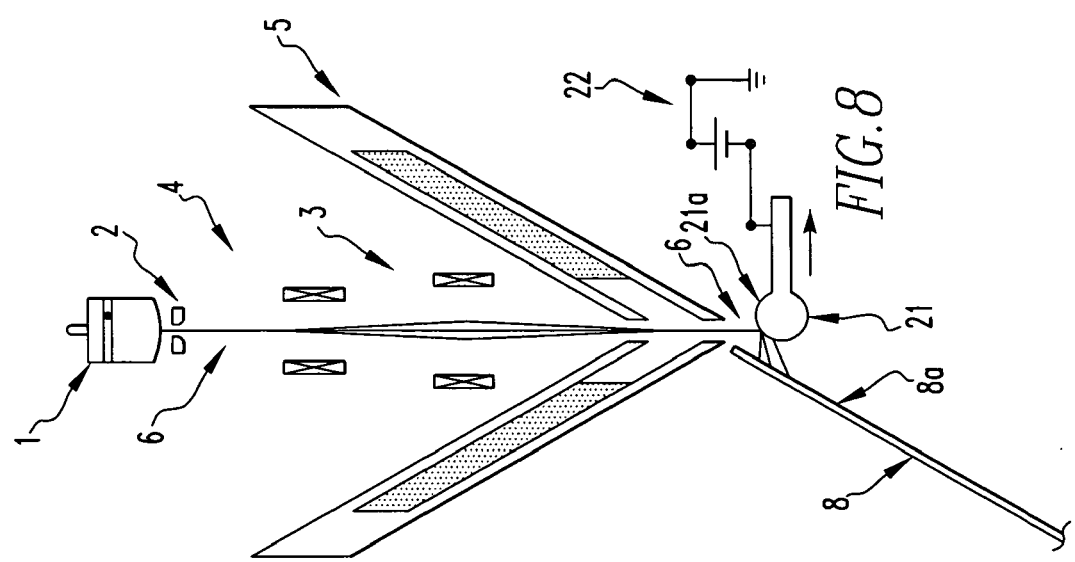
FIG. 9 is a diagram illustrating a fourth embodiment of the method of detecting information from a specimen in accordance with the present invention.

A fourth embodiment is shown in FIG. 9, where the electron beam 6 is deflected by the deflection system 3 to achieve offset incidence of the beam. In this case, an offset control value is supplied to the deflection system 3 from the scanning unit 11 (see FIG. 1).

In the first through fourth embodiments described above, a voltage that is equal to or higher than the accelerating voltage on the electron beam 6 is applied to the electrostatic electrode 21 from the deflection voltage power supply 22.

Where the same voltage as the accelerating voltage on the electron beam 6 is applied as the deflection voltage to the electrostatic electrode 21, the deflection voltage power supply 22 can also act as the accelerating voltage power supply 13 for applying the accelerating voltage to the electron gun 1. In this case, the deflection voltage power supply 22 is made of the accelerating voltage power supply 13.

The electric field produced by the reflective electrostatic electrode at the minimum applied voltage is distorted by the surrounding structures. SEM imaging at low aberration can be accomplished by suppressing the voltage applied to the electrostatic electrode 21. In the above embodiment, the accelerating voltage power supply 13 is used as the deflection voltage power supply 22. This makes it possible to reflect the electron beam 6 with the minimum voltage applied to the electrode 21.

The output voltage of the power supply is varied by environmental conditions, especially temperature variations. In the above-described case, the deflection voltage power supply 22 is used also as the accelerating voltage power supply 13. This can eliminate the potential difference between the electron beam 6 (i.e., primary beam) and the electrostatic electrode 21. The beam 6 can be reflected or deflected stably.

Where disturbance in the electric field produced by the electrostatic electrode 21 is minimized and the electron beam 6 is reflected, it is important to take account of the profile of the electrode forming the electric field. For this purpose, at least the electrostatic electrode 21 in the region reflecting the beam 6 preferably has a spherical surface.

Therefore, in the present invention, the front end portion 21*a* of the electrostatic electrode 21 is spherical in shape. Consequently, the electric field produced by the electrode 21 spreads out spherically. Hence, disturbance in the electric field due to the electrode 21 can be reduced to a minimum.

Where a voltage higher than the accelerating voltage on the electron beam 6 is applied to the electrostatic electrode 21, the deflection voltage power supply 22 can be made of a superimposed power supply consisting of the accelerating voltage power supply 13 to which an additional power supply (not shown) is attached.

The deflection voltage power supply 22 may be made of a power supply unit separate from the accelerating voltage power supply 13. This power supply unit applies a voltage, which is equal to or higher than the accelerating voltage on the electron beam 6, to the electrostatic electrode 21.

It is to be understood that the above-described positional relationship among the objective lens 5, specimen 8, electrostatic electrode 21, and electron beam 6 in each embodiment described above merely forms one embodiment of the present invention. The feature of the present invention is that an electric potential corresponding to the accelerating voltage on the electron beam 6 is applied to the electrostatic electrode 21 disposed on a downstream side of the objective lens 5 to deflect the beam 6 hitting the specimen 8. Therefore, the invention is not limited to the positional relationships shown in the embodiments.

A fifth embodiment of the method of detecting information from a specimen in accordance with the present invention is next described by referring to FIGS. 10 and 11. In this embodiment, there are provided a first electrostatic electrode 21 and a second electrostatic electrode 31.

Furthermore, in the present embodiment, the specimen 8 is placed vertically inside the specimen chamber 15. The outer periphery 8*a* of the specimen 8 is located between the front end portion 21*a* of the first electrostatic electrode 21 and the front end portion 31*a* of the second electrostatic electrode 31. Deflection voltage power supplies 22 and 32 are connected with the first and second electrostatic electrodes 21 and 31, respectively.

Where no deflection voltage is applied to the two electrostatic electrodes 21 and 31, the electron beam 6 scans the side surface 8*b* of the outer periphery 8*a* by deflection of the beam 6 caused by the deflection system 3 as shown in FIG. 10. Consequently, a scanned image of the side surface 8*b* is obtained, and an inspection can be performed.

Alternatively, a given deflection voltage may be applied to both of the first and second electrostatic electrodes 21, 31. The electron beam 6 is directed at a selected one of the electrodes 21 and 31 by controlling the amount of deflection of the electron beam (primary beam) 6 caused by the deflection system 3 as shown in FIG. 11. The beam 6 is reflected by the front end portion of the selected electrostatic electrode. Thus, the beam 6 is scanned over the front or rear surface of the outer periphery 8*a* of the specimen. A scanned image of the front or rear surface is gained, and an inspection can be performed.

Since the specimen 8 is at ground potential at this time, even if the deflection potential is applied to the unselected electrostatic electrode, focusing of the beam 6 is not affected. If necessary, two or more electrostatic electrodes may be provided.

Figure 13:
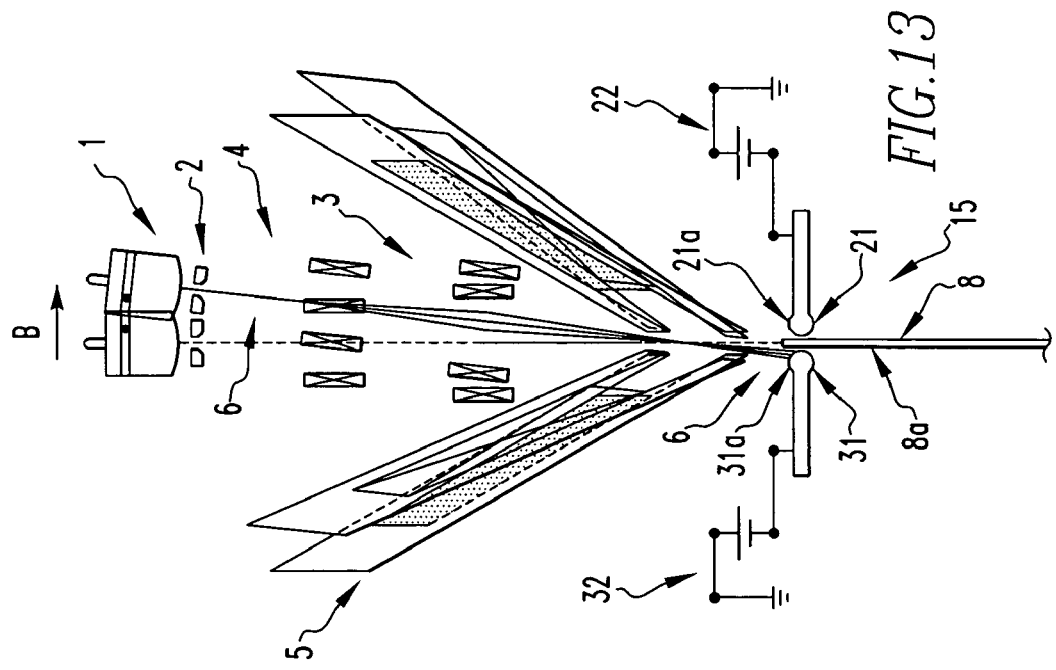
FIGS. 12 and 13 are diagrams illustrating a sixth embodiment of the method of detecting information from a specimen in accordance with the present invention.
Figure 12:
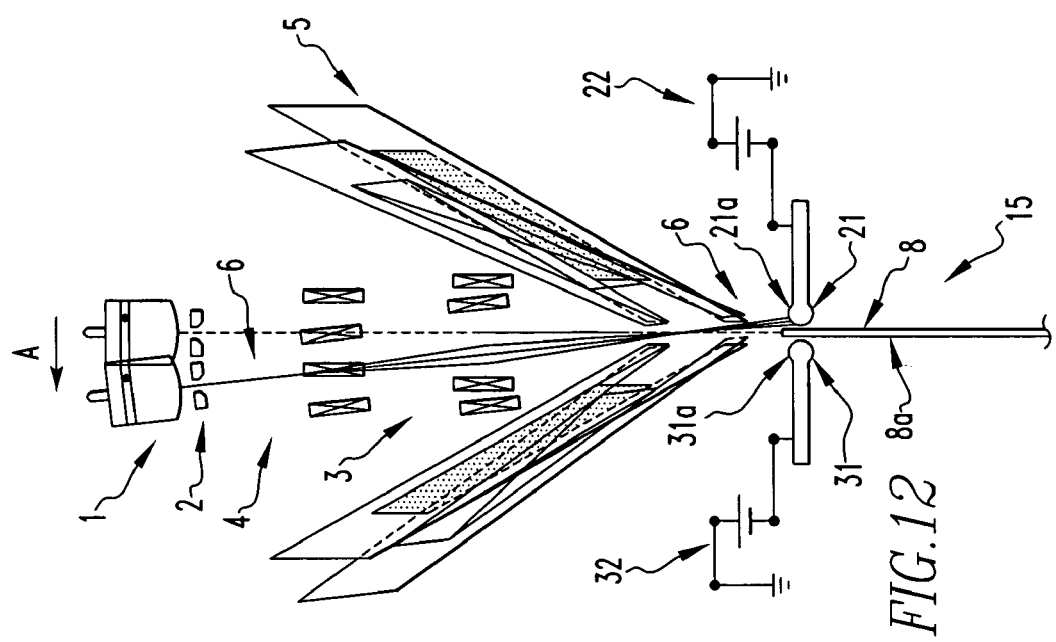

A sixth embodiment of the method of detecting information from a specimen in accordance with the present invention is next described by referring to FIGS. 12 and 13. In the present embodiment, the tilt angle of the microscope column relative to the specimen chamber 15 can be adjusted, the microscope column 4 consisting of electron gun 1, aperture mechanism 2, deflection means 3, and objective lens 5.

That is, where the microscope column 4 is tilted in the direction indicated by the arrow A in FIG. 12, the electron beam 6 from the electron gun 1 travels toward the first electrostatic electrode 21. In this case, the beam 6 is reflected by the front end portion 21*a* of the first electrostatic electrode 21 and hits one surface of the outer periphery 8*a* of the specimen 8. Thus, an inspection can be performed by obtaining a scanned image of this one surface.

Where the microscope column 4 is tilted in the direction indicated by the arrow B shown in FIG. 13, the beam 6 from the electron gun 1 travels toward the second electrostatic electrode 31. In this case, the beam 6 is reflected by the front end portion 31*a* of the second electrostatic electrode 31 and impinges on the other surface of the outer periphery 8*a* of the specimen 8. In consequence, an inspection can be performed by obtaining a scanned image of the other surface.

Figure 14:
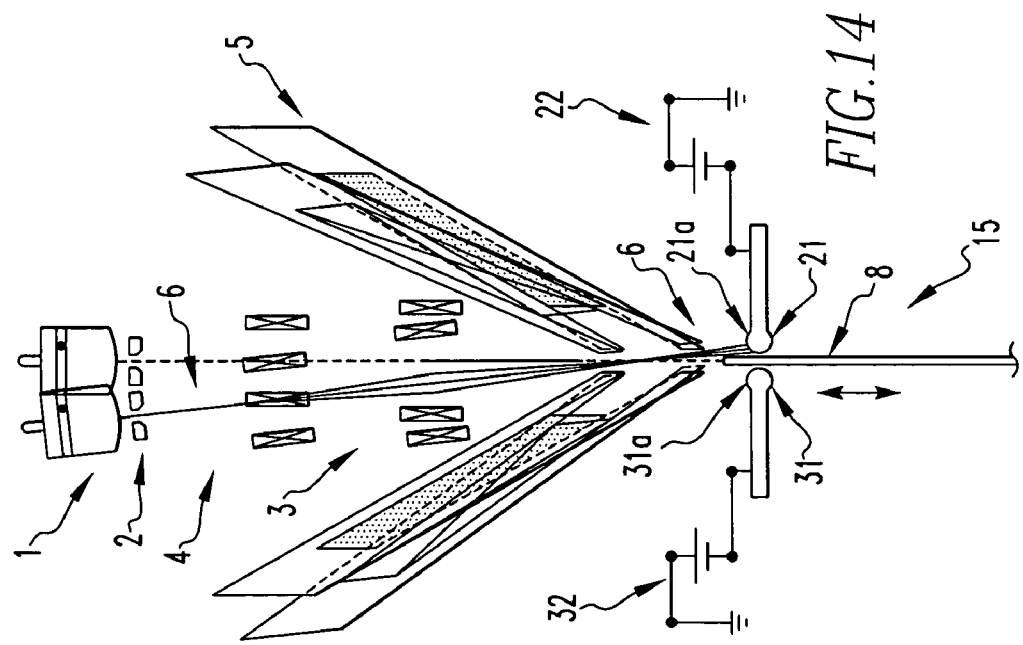

A seventh embodiment of the method of detecting information from a specimen in accordance with the present invention is next described by referring to FIG. 14. In this embodiment, the tilt angle of the microscope column 4 relative to the specimen chamber 15 is adjustable in the same way as in the sixth embodiment. Furthermore, in this embodiment, the specimen 8 placed vertically between the first electrostatic electrode 21 and the second electrostatic electrode 31 moves vertically. Therefore, a wider area on the specimen surface can be inspected by moving the specimen 8 vertically when the beam 6 reflected from the electrode 21 or 31 hits the specimen 8.

Figure 15:
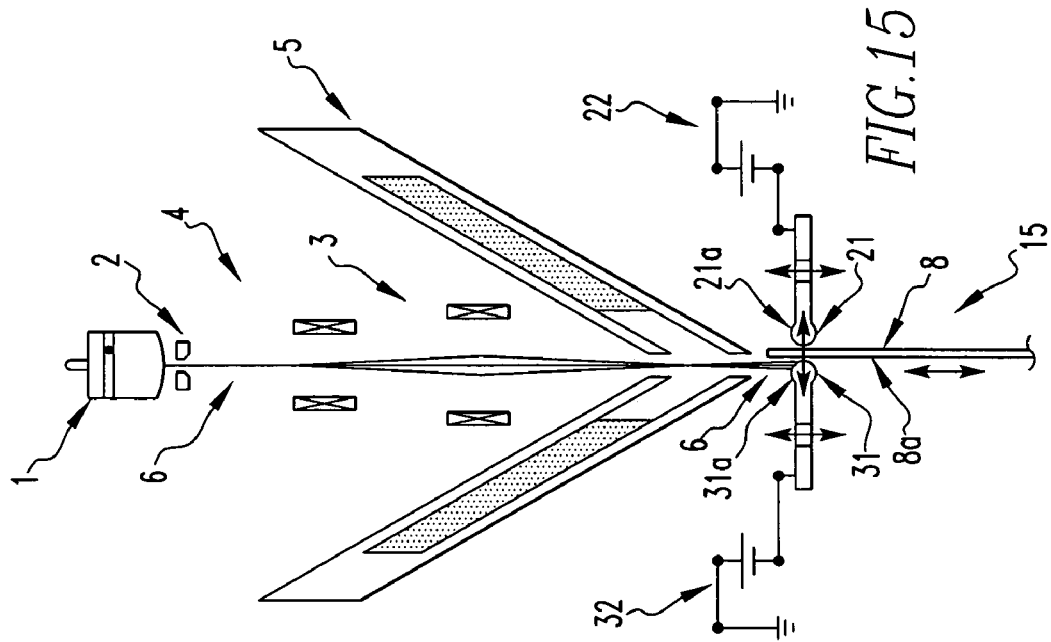
FIGS. 14 and 15 are diagrams illustrating a seventh embodiment of the method of detecting information from a specimen in accordance with the present invention.

Alternatively, as shown in FIG. 15, the first electrostatic electrode 21 and second electrostatic electrode 31 disposed on the opposite sides of the specimen 8 may be made appropriately movable horizontally together with the specimen 8. The beam 6 may be directed at any one of the electrodes 21 and 31. Thus, the beam 6 reflected by the front end portion of this one electrode may hit the specimen 8.

In the embodiment shown in FIG. 15, the second electrostatic electrode 31 is located so as to act as this one electrostatic electrode. The electron beam 6 is directed at the second electrostatic electrode. Therefore, in this embodiment, the beam 6 reflected by the front end portion 31*a* of the second electrostatic electrode 31 impinges on the specimen 8. A still wider area on the specimen surface can be inspected by moving at least one of the electrodes 21, 31 and specimen 8.

In the fifth through seventh embodiments, when the electron beam 6 is deflected by the electric field produced by one of the first and second electrostatic electrodes 21 and 31 applied with a deflection voltage, the deflection voltage applied to the other electrostatic electrode may be controlled independently. In addition, the application of the deflection voltage to the other electrostatic electrode may be ceased. Consequently, the detection efficiency of the electron detector 9 (see FIG. 1) at which electrons 7 are detected can be improved.

In the first through seventh embodiments, the front end portion of each electrostatic electrode is not limited to a spherical shape. The front end portion may be shaped into any desired curved surface.

In this way, in the present invention, the charged-particle beam passed through the objective lens is reflected or deflected by the electrostatic electrode located on a downstream side of the objective lens. The deflected beam is made to hit the specimen, and information about the specimen surface located on the side of the electrostatic electrode is detected.

Consequently, the side or rear surface of the outer periphery of the specimen can be inspected by placing the side or rear surface of the outer periphery in an opposite relation to the electrostatic electrode and placing the side or rear surface on a side of the electrostatic electrode. Hence, the side or rear surface of the outer periphery of the specimen can be inspected with a simple instrumental structure.

Having thus described my invention with the detail and particularity required by the Patent Laws, what is desired protected by Letters Patent is set forth in the following claims.

The invention claimed is:

1. A charged-particle beam instrument comprising:
    a source of charged particles for emitting an accelerated beam of charged particles;
    an objective lens for focusing said beam onto a specimen disposed within a specimen chamber;
    deflection means located between said source of charged particles and said objective lens and acting to deflect said beam of charged particles;
    a detector for detecting information emanating from the specimen in response to impingement of the beam of charged particles;
    at least one electrostatic electrode located on a downstream side of said objective lens and acting to deflect the beam of charged particles passed through the objective lens such that the beam hits the specimen wherein said electrostatic electrode has a front end portion shaped as a spherical surface or as a curved surface; and
    a deflection voltage power supply for applying a deflection voltage to the electrostatic electrode.

2. A charged-particle beam instrument as set forth in claim 1, wherein said deflection voltage power supply is used also as an accelerating voltage power supply for accelerating said beam of charged particles.

3. A charged-particle beam instrument as set forth in claim 1, wherein the deflection voltage applied by said deflection voltage power supply is higher than the accelerating voltage on said beam of charged particles.

4. A charged-particle beam instrument as set forth in claim 3, wherein said deflection voltage power supply is made of a superimposed power supply consisting of an accelerating voltage power supply and an additional power supply connected with said accelerating voltage power supply acting to accelerate said beam of charged particles.

5. A charged-particle beam instrument as set forth in any one of claims 1 to 4, wherein said at least one electrostatic electrode is plural in number.

6. A charged-particle beam instrument as set forth in any one of claims 1 to 5, further including a drive mechanism for moving said electrostatic electrode.

7. A charged-particle beam instrument as set forth in any one of claims 1 to 6, wherein said source of charged particles, said deflection means, and said objective lens together constitute a microscope column, and wherein said microscope column is tilted relative to said specimen chamber at an adjustable angle.

8. A method of detecting information produced from a specimen in response to impingement of a beam of charged particles that is focused by an objective lens and directed at the specimen, said method comprising the step of:
    deflecting the beam of charged particles passed through said objective lens by an electrostatic electrode located on a downstream side of said objective wherein said electrostatic electrode has a front end portion shaped as a spherical surface or as a curved surface lens such that the deflected beam is directed at the specimen.

9. A method of detecting information produced from a specimen as set forth in claim 8, wherein a portion of said specimen to be detected is placed near the gap between said objective lens and said electrostatic electrode, and wherein information about a surface of the specimen facing the electrostatic electrode is detected.

10. A method of detecting information produced from a specimen as set forth in claim 8 or 9, wherein information about a surface of the specimen facing the electrostatic electrode is detected while the specimen is tilted.

11. A method of detecting information produced from a specimen as set forth in claim 10, wherein information about the surface of the specimen is detected while said electrostatic electrode is being moved.

12. A method of detecting information produced from a specimen as set forth in claim 10, wherein the beam of charged particles focused by said objective lens is deflected by deflection means located on an upstream side of the objective lens.

13. A method of detecting information produced from a specimen in response to impingement of a beam of charged particles that is focused by an objective lens and directed at the specimen, said method comprising the steps of:
    passing the beam of charged particles through the objective lens; and
    then deflecting the beam by any one of first and second electrostatic electrodes wherein said electrostatic electrodes have a front end portion shaped as a spherical surface or as a curved surface located on a downstream side of the objective lens such that the deflected beam is directed at the specimen.

14. A method of detecting information produced from a specimen as set forth in claim 13, wherein a portion of said specimen to be detected is placed between said first and second electrostatic electrodes.

15. A method of detecting information produced from a specimen as set forth in claim 13 or 14, wherein the beam of charged particles focused by said objective lens is deflected by the deflection means located on an upstream side of the objective lens.

16. A method of detecting information produced from a specimen as set forth in claim 14, wherein said first and second electrostatic electrodes are made movable together with the specimen, and wherein the beam of charged particles directed at any one of the first and second electrostatic electrodes is deflected by this one electrostatic electrode.

* * * * *